United States Patent
Kramer

(10) Patent No.: US 9,420,717 B2
(45) Date of Patent: Aug. 16, 2016

(54) PLUG-IN UNIT PROTECTION

(75) Inventor: Hans Kramer, Nynashamn (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 286 days.

(21) Appl. No.: 13/413,272

(22) Filed: Mar. 6, 2012

(65) Prior Publication Data

US 2013/0235495 A1 Sep. 12, 2013

Related U.S. Application Data

(63) Continuation of application No. PCT/EP2011/073083, filed on Dec. 16, 2011.

(51) Int. Cl.
*H01H 47/00* (2006.01)
*H05K 7/14* (2006.01)
*H05K 9/00* (2006.01)

(52) U.S. Cl.
CPC ............ *H05K 7/1461* (2013.01); *H05K 9/0062* (2013.01); *H05K 9/0067* (2013.01); *Y10T 29/49718* (2015.01); *Y10T 428/24479* (2015.01)

(58) Field of Classification Search
CPC .. H05K 7/1461; H05K 9/0062; H05K 9/0067

USPC ......................................................... 361/220
See application file for complete search history.

(56) References Cited

U.S. PATENT DOCUMENTS

| 5,594,204 | A | 1/1997 | Taylor et al. |
| 6,273,730 | B1 | 8/2001 | Chang |
| 7,450,375 | B2 * | 11/2008 | Xu ............................ 361/679.33 |

FOREIGN PATENT DOCUMENTS

| DE | 200 03 706 U1 | 5/2000 |
| WO | WO 98/36628 A1 | 8/1998 |

OTHER PUBLICATIONS

International Search Report Corresponding to International Application No. PCT/EP2011/073083; Date of Mailing: Feb. 13, 2013; 3 Pages.

* cited by examiner

*Primary Examiner* — Thienvu Tran
*Assistant Examiner* — Tien Mai
(74) *Attorney, Agent, or Firm* — Myers Bigel & Sibley, P.A.

(57) ABSTRACT

A plug-in unit that is configured to stacking in an electronic equipment unit is protected during replacement of an adjacent plug-in unit in the electronic equipment unit by providing at least one fender on at least one side of the plug-in unit.

19 Claims, 6 Drawing Sheets

PLUG-IN UNIT PROTECTION

CROSS REFERENCE TO RELATED APPLICATION

This application claims priority to International Application No, PCT/EP2011/073083, filed on Dec. 16, 2011, the entire contents of which is fully incorporated herein by reference.

TECHNICAL FIELD

The present disclosure generally concerns plug-in units, such as printed circuit cards/boards or electronic modules for mounting in stacked relationship in electronic equipment units, such as magazine racks.

BACKGROUND

Electronic equipment units, such as magazine racks or sub-racks of telecommunications cabinets, frequently include stacked plug-in units in the form of printed circuit boards (PCB) or cards. Such multiple plug-in units are normally densely stacked in order to effectively use the available space within the magazine rack. A common requirement is that it must be possible to replace plug-in units in a magazine rack without disturbing other units therein. The replacement may also have to be performed with the power to the magazine on.

Dense stacking may cause problems in connection with such replacement of plug-in units, when plug-in units are inserted into, and to a certain degree also when they are withdrawn from, a magazine rack. In particular, problems appear before the plug-in units enter and are properly guided in associated top and bottom edge guide channels. Due to inappropriate or careless replacement of plug-in units neighbouring plug-in units may easily be damaged by components or connectors associated with the replaced units. Altogether, this may cause problems that are especially severe in situations where adjacent units in a magazine stack must be maintained in operating mode during replacement of a unit. Inadvertent contact between plug-in units of a magazine may have various consequences, ranging from simple scratching or scraping of components and/or circuitry of a printed circuit board and to very severe short circuiting of an entire plug-in unit.

No attempts to solve the discussed types of problems have been noted in the prior art. In related areas attempts have been made to solve problems associated especially with replacing expansion cards in live computer chassis. Solutions presented for use in such environments involve the use of special plastic material carriers that accommodate, guide and protect the expansion cards. Apart from being expensive such enclosing card carriers would require unacceptably much space in a magazine.

SUMMARY

A general object is to provide a solution to the described problems.

A specific object is to provide an improved method of protecting a plug-in unit during replacement of an adjacent plug-in unit in an electronic equipment unit.

Another specific object is to provide an improved plug-in unit for stacking in an electronic equipment unit.

A further specific object is to provide a fender for protecting a plug-in unit.

These and other objects are met by embodiments defined by the accompanying claims.

In a first aspect the technology relates generally to a method of protecting a plug-in unit during replacement of an adjacent plug-in unit in an electronic equipment unit. In a basic configuration at least one fender is provided on at least one side of the plug-in unit that is intended for stacking in the electronic equipment unit.

In another aspect the technology relates to a plug-in unit for stacking in an electronic equipment unit. In a basic configuration at least one fender is provided on at least one side of the plug-in unit.

In a further aspect the technology relates to a fender for protecting a plug-in unit. In a basic configuration the fender has a generally planar bottom surface for securing to a plug-in unit and an elevated and at least partially curved or chamfered upper surface.

These basic configurations present the advantages of:
effectively protecting plug-in units during replacement of adjacent units;
allowing plug-in unit replacement in magazines maintained in operating mode;
allowing for certain initial misalignment of units without causing scraping or short-circuiting of adjacent units; and thereby
enabling quick, simple and effective plug-in unit replacement.

Advantages offered in addition to those described, will be readily appreciated upon reading the below detailed description of embodiments.

BRIEF DESCRIPTION OF THE DRAWINGS

Further objects and advantages of the present technology will be best understood by reference to the following description of exemplifying embodiments and to the accompanying drawings, in which.

DETAILED DESCRIPTION

Figure 5:
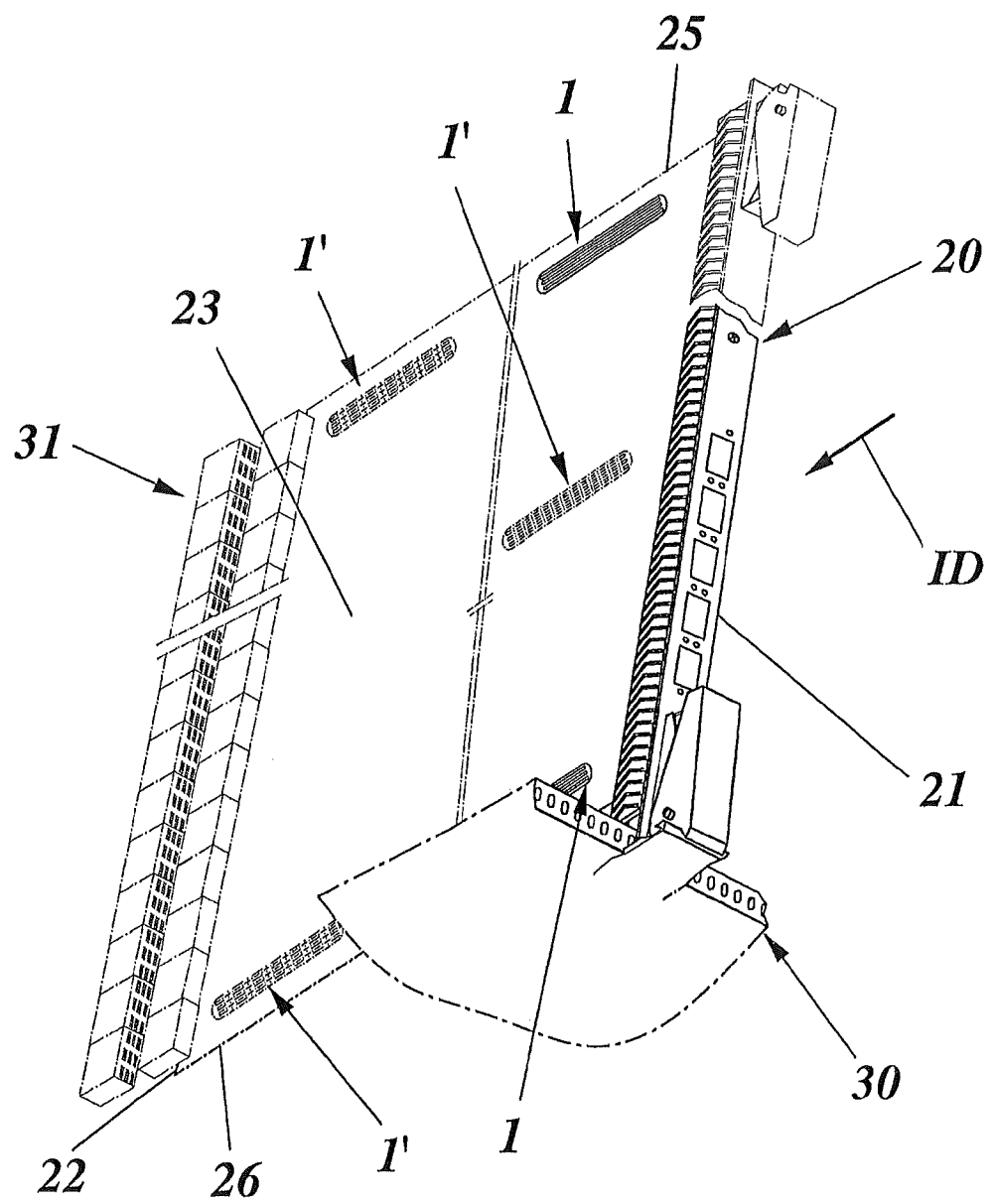
FIG. 5 is a schematical and partial perspective view of an embodiment of the use of protective fenders on an exemplary plug-in unit in an electronic equipment unit.

The present technology will be explained below with reference to exemplifying embodiments of a method of protecting a plug-in unit in an electronic equipment unit and of a plug-in unit as well as a fender for use therein. The embodiments relate to an application of the present technology to plug-in units, including printed circuit boards or electronic modules that are accommodated in electronic equipment units, such as magazine racks or cabinets. The present technology may be applied in the telecommunications field or in other fields where such plug-in units and electronic equipment units serve. For simplicity, the magazine racks will for the rest of the specification be referred to only as magazines. It is emphasized that the printed circuit board and the magazine that are schematically illustrated in the attached FIG. 5 are only given as an example of an environment where the present technology may be applied. This technology is equally well suited for application to other types of environments and for other types of plug-in units. Thus, the illustrations are for the sole purpose of describing preferred embodiments of the present technology and are not intended to limit the technology to details or to any specific field of application. It shall be realized that the disclosure covers the incorporation of features related to other applications and any combination of features disclosed herein.

As was discussed in the introduction no presently available practical solution has been found for enabling secure replacement of plug-in units in "live" magazines, i.e. magazines maintained in operating mode. Existing solutions intended for related areas are based on the use of expensive and space consuming card carriers. It is apparent that cost and space issues are vital in many areas of application for plug-in units, such as for densely stacked rack-mounted printed circuit boards in telecommunications magazines.

The present technology attempts to find a solution to the problems encountered when replacing densely stacked plug-in units in "live" magazines. A new approach for protecting adjacent or neighbouring plug-in units in such applications is proposed. A general object of the present technology is to provide a fairly inexpensive solution that provides effective protection and that does in effect not add to the space occupied by the plug-in units. The solution will provide reliable protection to a plug-in unit during replacement of an adjacent plug-in unit, and may provide such protection both with regard to the withdrawal of an old, replaced plug-in unit and to the insertion of a new replacement plug-in unit. Specifically, the basic idea of the proposed solution is to secure a protective device to at least one side of a plug-in unit. This protective device is throughout the specification and claims named a fender that with the general definition of the word is a device serving as a protective barrier. Alternatively the protective device may be called a bumper. The term "secure" is in the specification used in a very general meaning to indicate that the fender is supported by the plug-in unit. In fact, the fender may within the suggested technology be attached, fixed or fastened to the plug-in unit by means of adhesive, fasteners etc, or may even be integrated in the plug-in unit base material, such as a substrate.

Figure 1:
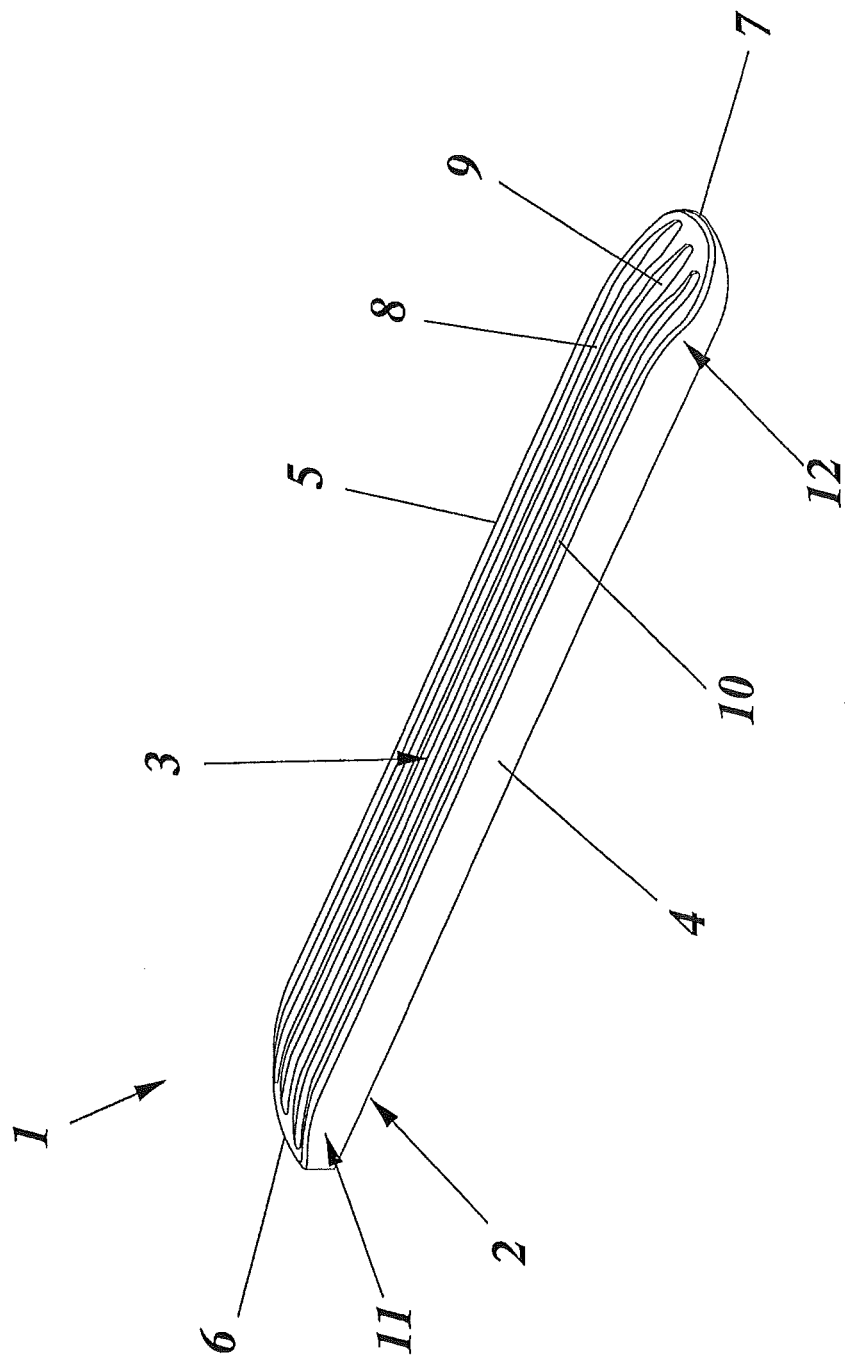
FIG. 1 is a schematical perspective view of a first embodiment of a protective fender.

The present technology will be explained below with reference to exemplifying schematical embodiments thereof that are illustrated in the accompanying drawing FIGS. 1-6. In FIG. 1 is outlined an example of a protective fender 1 as used for protecting a plug-in unit 20 (FIG. 5), such as a printed circuit board PCB or an electronic module. Specifically, the plug-in unit 20 is protected during insertion of an adjacent plug-in unit into or withdrawal thereof from an electronic equipment unit 30, such as a magazine (FIG. 5). In this example the protective fender 1 has an elongated shape and the length thereof may depend upon the application. In particular the chosen length may depend upon the disposition of components and circuit elements on the plug-in units 20. A further influencing factor is the distance that the plug-in units will have to be inserted before being guided by upper and lower edge guide channels (not particularly shown) in the magazine 30.

In a particular example the protective fender 1 has a generally planar, i.e. flat, bottom 2 surface that is intended for securing to an available free space at one side 23 or 24 (see FIGS. 5 and 6) of a plug-in unit 20. An upper surface 3 of the fender 1 is elevated with regard to its planar bottom surface 2 and thereby also with regard to a surface of the respective plug-in unit 20 side 23, 24 when secured thereto. The upper surface 3 is preferably at least partially curved or chamfered. In the latter case it should have a low-angle, wide chamfer forming no substantial edge that might otherwise engage plug-in unit 20 components or circuit elements. In the shown embodiment the fender 1 has an elongated shape with a ramp-like curvature of at least portions 11, 12 of the upper surface 3 sloping towards respective opposite ends 6, 7 of the bottom surface 2 of the fender 1. Likewise, the transition between the upper surface 3 and side edges 4, 5 of the fender are preferably curved or chamfered.

Figure 6:
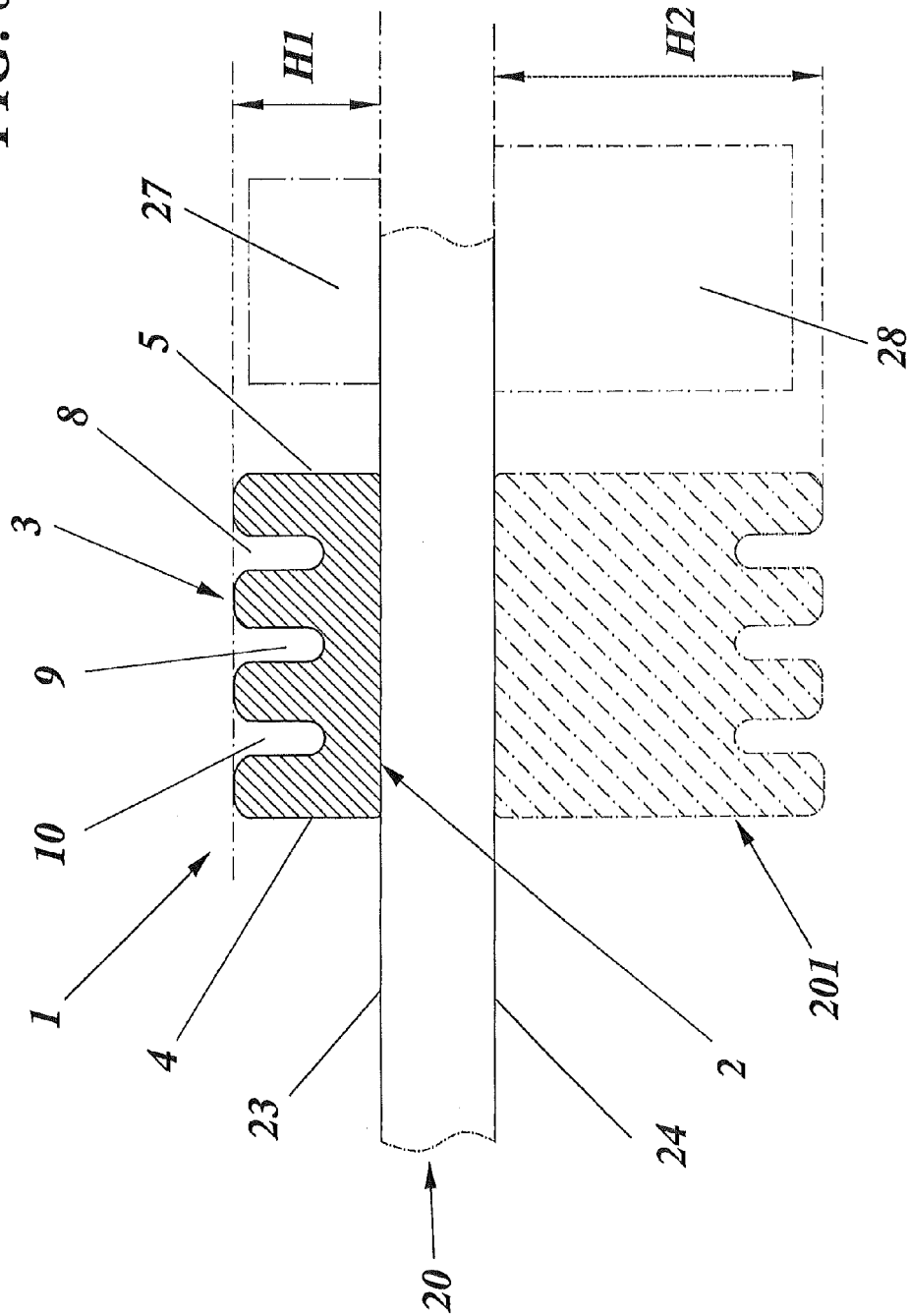
FIG. 6 is a schematical and partial cross section through a plug-in unit, illustrating the alternative use of differently sized protective fenders on respective sides thereof.
Figure 7:
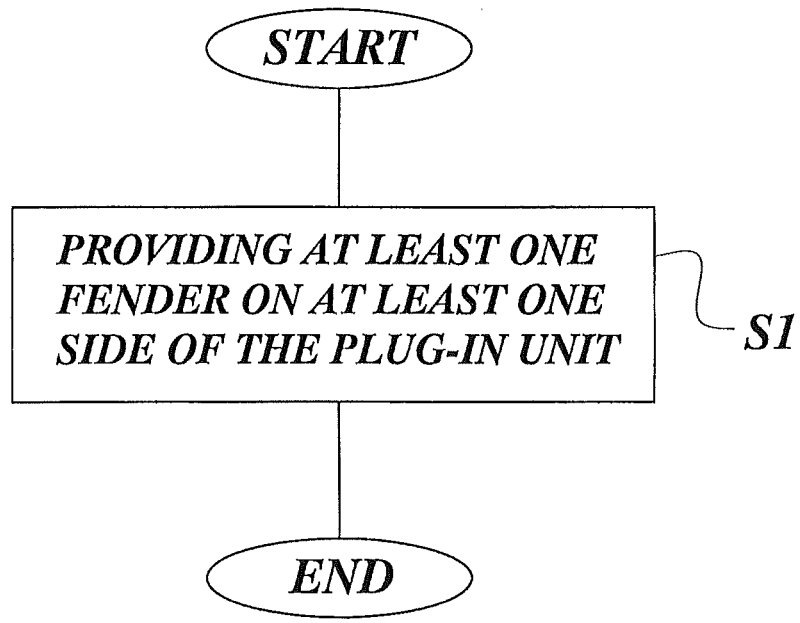
FIG. 7 is a flow diagram of a method of protecting a plug-in unit.

The described curved and sloping design of the fender 1 serves the main purpose of securing that the fender has no sharp corners or edges that could otherwise unduly impact or even get stuck on and rip off components or circuit elements. For similar reasons the fender 1 is preferably at least partly formed of a material basically having non-abrading properties. This is to avoid scraping and scratching of neighbouring plug-in units 20. The fender 1 shall at least in the most elevated areas of its upper surface 3 have a height H1 or H2 that with reference to FIG. 6 is adapted to the height of components/circuit elements 27, 28 on the plug-in unit 20 at which it is provided.

For all applications and especially for use in environments where plug-in units are inserted into and withdrawn from "live" magazines, it is vital that the fender prevents short-circuiting of plug-in units and components. In this context "live" magazines refers to magazines where neighbouring plug-in units are maintained in operating mode during replacement. The fender 1 is thus preferably made or formed of a material having electrostatic discharge (ESD) protective properties, e.g. static dissipative material. Such a material will prevent the generation of electrostatic charges or will dissipate electrostatic charges.

Figure 2A:
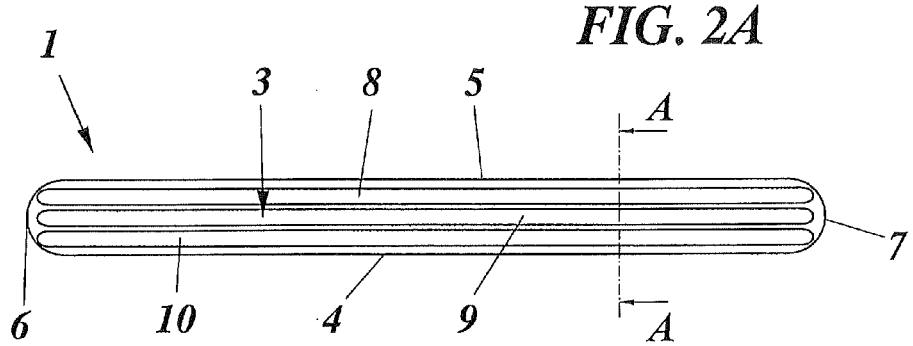
FIG. 2A is a schematical top view of the protective fender of FIG. 1.
Figure 2B:
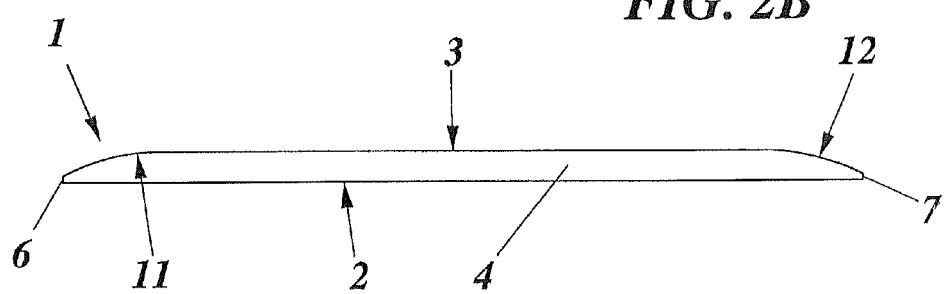
FIG. 2B is a schematical side view of the protective fender of FIG. 1.
Figure 2C:
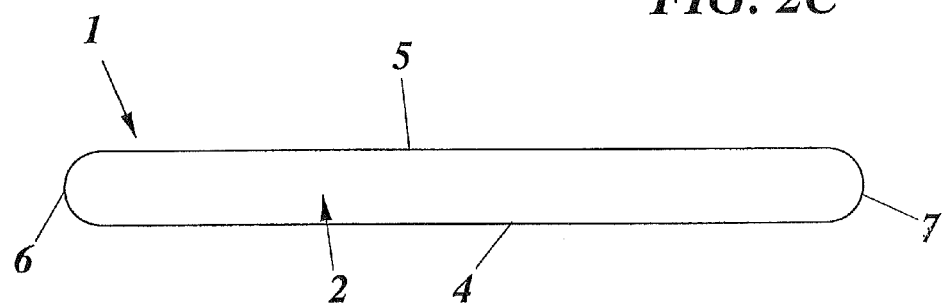
FIG. 2C is a schematical bottom view of the protective fender of FIG. 1.
Figure 3:
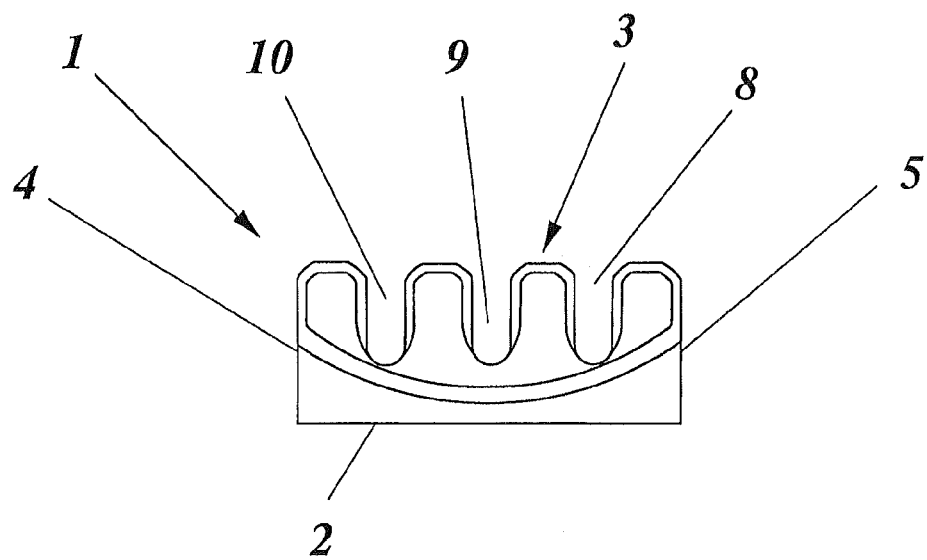
FIG. 3 is a schematical end view of the protective fender of FIG. 1.
Figure 4:
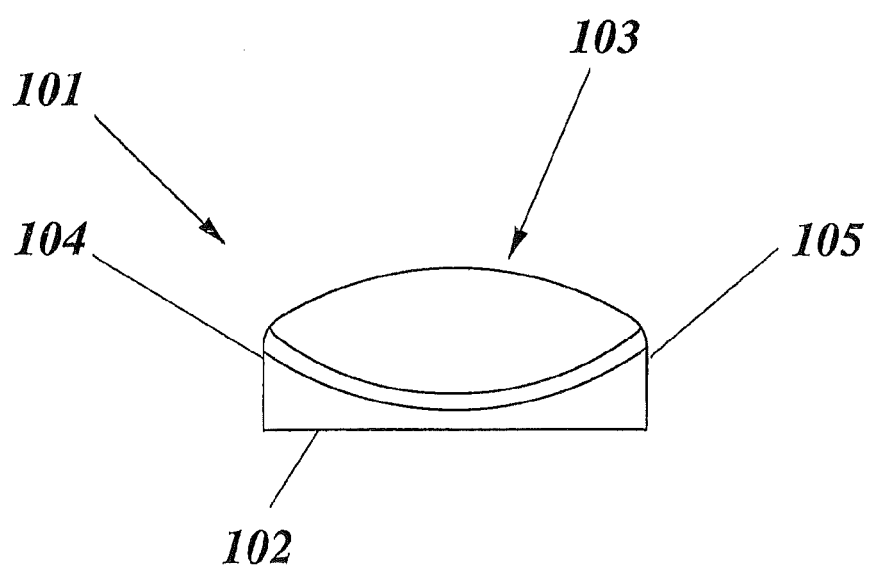
FIG. 4 is a schematical end view of a second embodiment of a protective fender.

In the embodiment illustrated in FIGS. 1-3 the fender 1 upper surface 3 has a number of (here three) parallel longitudinal grooves 8-10 extending along approximately the full length of the fender 1. Said grooves 8-10 are provided to avoid non-uniform shrinking when molding a fender of plastic. Such shrinking may otherwise cause bending or other deformation of the fender 1 so that it cannot be properly secured to a plug-in unit 20. In FIG. 4 is illustrated that the fender 101 could alternatively be configured without the longitudinal grooves although this would require using another manufacturing technique or another material for the fender 101. In this case the upper surface 103 is continuous and like before slopes with a ramp-like curvature towards both opposite ends of the generally planar bottom surface 102 and has a curved or rounded transition to the side edges 104, 105.

From the above description it should now be clear that the disclosure is concerned with protecting plug-in units, e.g. printed circuit boards (PCB) or electronic modules during replacement. Such replacement involves the insertion as well as withdrawal of adjacent plug-in units 20 in electronic equipment units 30, such as magazines. With reference to FIG. 5, the problem is that a plug-in unit 20, such as a printed circuit board 20 in position in the magazine 30 can be damaged when another replacement plug-in unit is inserted to the left thereof. As mentioned above, damages may conventionally include scraping or short-circuiting of such a plug-in unit 20 to the right. The scraping or short-circuiting is often caused by end connector 31 parts carried by an inner or rear edge 22 of the inserted plug-in unit 20. The insertion phase of the replacement plug-in unit has been specifically mentioned. However, similar scraping and short-circuiting problems may theoretically appear also during the last stage of withdrawing a plug-in unit that is to be replaced.

According to the present technology such problems are solved by providing a plug-in unit 20 intended for stacking in an electronic equipment unit/a magazine 30. The plug-in unit 20 has at least one of the described fenders 1 being provided on at least one side 23, 24 thereof. The fender or fenders 1 preferably has/have electrostatic discharge (ESD) protective properties. With reference to FIG. 5, a basic embodiment of a protected plug-in unit 20 has at least one fender 1, in the example illustrated in FIG. 5 two fenders, being provided on a secondary side 23 of the plug-in unit 20. This secondary side 23 is generally a left side of the plug-in unit 20 as viewed in FIG. 5. This secondary side 23 is normally a "non-component" side that does not carry major components 28 (FIG. 6) but predominantly circuit elements and minor components 27 (likewise shown in FIG. 6). In the embodiment of FIG. 5 the two fenders 1 are secured to the plug-in unit 20 adjacent an outer or front edge 21 thereof with regard to a direction ID of insertion of the plug-in unit 20 into the electronic equipment unit 30. As is indicated in FIG. 5 a fender or fenders 1' may also or alternatively be provided adjacent the inner, with regard to the insertion direction ID, edge 22 of the plug-in unit 20, on the secondary non-component side 23 thereof. Likewise, further fenders 1' may theoretically be provided on the plug-in unit 20 also in a central area thereof. The fender or fenders 1 are generally elongated and are provided on the plug-in unit 20, extending in a direction generally coinciding with the direction ID of insertion of the plug-in unit 20 into the electronic equipment unit 30. In their most elevated areas such secondary side protective fenders 1 have a height H1 (see FIG. 6) between their upper 3 and lower 2 surfaces. This height H1 should at least equal and preferably exceed the height of components or circuit elements 27 on the secondary 23 side of the plug-in unit 20. The height of the secondary side components or circuit elements 27 is measured in a direction perpendicular to the surface of said side. By way of example the height may for many applications typically be in the order of 2 mm. The two fenders 1 are shown being provided in areas of the plug-in unit 20 close to upper and lower side edges 25, 26 thereof. Said side edges 25, 26 are typically guided in guide channels of the magazine 30 once the unit 20 has been properly inserted by an initial distance. In a particular example, the fender or fenders 1 is/are separate from the plug-in unit 20 and is/are secured thereto. In another example the fender or fenders 1 are integrated in the plug-in unit 20.

It should be understood that the present technology likewise concerns a method of protecting a plug-in unit 20 during replacement of an adjacent plug-in unit in an electronic equipment unit 30. With reference to the basic embodiment, as schematically illustrated in FIGS. 5, 6 and/or 7, this is achieved by providing, in method step S1, at least one of the above described fenders 1, 1', 101, 201 on at least one side 23, 24 of a plug-in unit 20 that is intended for stacking in said electronic equipment unit 30. The fender or fenders being provided on the plug-in unit preferably have electrostatic discharge (ESD) protective properties. The fender or fenders 1, 1', 101, 201 may be secured as a separate part to the at least one side 23, 24 of the plug-in unit 20 or may alternatively be integrated in the plug-in unit. In examples the method involves providing the fender or fenders 1, 1' at a secondary side 23 of the plug-in unit 20, adjacent the outer edge 21 or alternatively the inner edge 22 thereof, with regard to the direction ID of insertion of the plug-in unit 20.

By way of example, a fender or fenders 1, 1', 101, 201 is/are provided on the plug-in unit 20, being generally elongated and extending in a direction that generally coincides with the insertion direction ID of the plug-in unit 20 into the electronic equipment unit 30. In other examples the basic method further involves providing the fender or fenders 201 adjacent an inner and or outer edge 22, 21, respectively, of the plug-in unit 20, with regard to the direction of insertion ID, on the primary side 24 thereof. On the plug-in unit 20 are provided a fender or fenders 1, 1', 101, 201 that at least in areas thereof has/have a height H1, H2 as measured in a direction perpendicular to the side or sides 23, 24 of the plug-in unit 20. The height H1, H2 of the provided fenders does at least equal and preferably exceeds the height of components or circuit elements on said side/sides of the plug-in unit 20. The height of the components or circuit elements is likewise measured from a surface of said side/sides.

The above described basic embodiments of the plug-in unit and method enable secure replacement of plug-in units in a magazine without disturbing other units being in operating mode. In particular the basic embodiments thereof provide a solution to the discussed scraping and short-circuiting problems. With reference to FIG. 5 this is achieved by securing fenders 1 to the secondary or left side 23 of the plug-in unit 20 close to the outer or front side 21 thereof. They are positioned there to prevent an inserted plug-in unit from accidentally engaging an existing, neighbouring plug-in unit 20 during initial insertion until it is properly guided in the magazine 30. As mentioned, the same naturally applies also to a withdrawal of a plug-in unit 20 from a magazine, during the short distance from its rear portion leaving the guide channels and until it is completely withdrawn.

Variations of the described embodiments of the plug-in unit as well as method include variations of the number of fenders that are secured to a plug-in unit 20 as well as of their proper positioning and dimensioning. As an example, the length of the generally elongated fenders may vary for different applications. However, said fender length will be shorter than the length of the plug-in unit in the insertion direction ID and preferably shorter than half the plug-in unit length. As a further example the number of fenders provided on a plug-in unit may range from only one provided fender and upwards. Such variations will at least partly depend upon the architecture of the plug-in unit 20. As was described above and is indicated in FIG. 5 further fenders 1' may theoretically be secured to a plug-in unit 20 in a central area thereof. Likewise, fenders 1' may also or alternatively be provided adjacent the inner, with regard to the insertion direction ID, edge 22 of the plug-in unit 20, on the secondary non-component side 23 thereof. Such alternative fender positions may serve to provide protection to specific areas or components of a plug-in unit. A further alternative positioning as well as dimensioning of fenders is schematically illustrated in FIG. 6 where at least one fender 201 is provided on a primary component side 24 of a plug-in unit 20, likewise being secured to or integrated in the plug-in unit. Although not specifically illustrated in FIG. 6 such primary side fenders 201 may likewise be positioned adjacent an inner and/or outer, with regard to their direction of insertion ID, edge 22, 21, respectively, of the plug-in unit 20. Being secured to a primary component side 24 of the plug-in unit 20 such primary side fenders 201 should at least in the most elevated areas thereof have a height H2 that at least equals and preferably exceeds the height of all components 28 or circuit elements on the primary side 24 of the plug-in unit 20. The height of such components 28 or circuit elements on the primary side 24 is likewise measured in a direction perpendicular to the surface of said side. By way of example the height may for many applications typically be in the order of 8 mm.

In further alternative, but not specifically illustrated embodiments of the present technology, variations of the described method and illustrated plug-in unit and fender configuration may be employed without departing from the scope of the present technology. To exemplify this, the fenders may for specific applications be provided in a required or appropriate number, at optional positions and on one or both sides of a plug-in unit as long as there is adequate free space available on said unit sides. To the contrary, the positions and the distribution of protective fenders on the unit sides may alternatively be standardized for efficient production. It shall also be emphasized that although the present technology has been described and illustrated with specific reference to the indicated applications thereof, the present technology is in no way restricted to such applications. The basic principles of the present technology may be used in association with other than the disclosed types of plug-in units as well as magazines or racks.

The present technology has been described in connection with an embodiment that is to be regarded as an illustrative example thereof. It will be understood by those skilled in the art that the present technology is not limited to the disclosed embodiments but is intended to cover various modifications and equivalent arrangements. The present technology likewise covers any feasible combination of features described and illustrated herein. The scope of the present technology is defined by the appended claims.

The invention claimed is:

1. A method of protecting a plug-in unit during replacement of an adjacent plug-in unit in an electronic equipment unit, comprising:
   providing at least one fender on at least one side of the plug-in unit that is configured for stacking in said electronic equipment unit, the at least one fender having a generally planar bottom surface for securing to the plug-in unit, an elevated upper surface, and first and second ends;
   wherein the upper surface is at least partially curved or chamfered between the first and second ends, such that the upper surface is non-planar when viewed as a cross section of the at least one fender in a direction that is perpendicular to a direction generally coinciding with a direction of insertion of the plug-in unit; and
   wherein the at least one fender is rigidly affixed to the plug-in unit, such that the upper surface of the at least one fender is configured so as not to move relative to the plug-in unit.

2. A method according to claim 1, wherein the at least one fender has electrostatic discharge (ESD) protective properties.

3. A method according to claim 1, further comprising:
   securing the at least one fender to the at least one side of the plug-in unit.

4. A method according to claim 1, wherein providing the at least one fender comprises providing the at least one fender on a secondary side of the plug-in unit, adjacent an outer or an inner edge thereof, with regard to the direction of insertion of the plug-in unit.

5. A method according to claim 1, wherein the at least one fender is generally elongated and extends in a direction generally coinciding with the direction of insertion of the plug-in unit into the electronic equipment unit.

6. A method according to claim 1, wherein providing the at least one fender comprises providing the at least one fender adjacent an inner and/or outer edge of the plug-in unit, with regard to the direction of insertion of the plug-in unit, on a primary side thereof.

7. A method according to claim 1, wherein the at least one fender has a height as measured in a direction perpendicular to a side of the plug-in unit that is not less than a height of components or circuit elements on the side of the plug-in unit from a surface of the side of the plug-in unit.

8. A method according to claim 1, further comprising:
   alternatively integrating the at least one fender in the plug-in unit.

9. A plug-in unit configured for stacking in an electronic equipment unit, comprising:
   at least one fender on at least one side of the plug-in unit, the at least one fender having a generally planar bottom surface for securing to the plug-in unit, an elevated upper surface, and first and second ends;
   wherein the upper surface is at least partially curved or chamfered between the first and second ends, such that the upper surface is non-planar when viewed as a cross section of the at least one fender in a direction that is perpendicular to a direction generally coinciding with a direction of insertion of the plug-in unit; and
   wherein the at least one fender is rigidly affixed to the plug-in unit, such that the upper surface of the at least one fender is configured so as not to move relative to the plug-in unit.

10. A plug-in unit according to claim 9, wherein the at least one fender has electrostatic discharge (ESD) protective properties.

11. A plug-in unit according to claim 9, wherein the at least one fender is disposed on a secondary side of the plug-in unit.

12. A plug-in unit according to claim 9, wherein the at least one fender is disposed adjacent an outer or an inner edge of the plug-in unit with regard to the direction (ID) of insertion of the plug-in unit into the electronic equipment unit.

13. A plug-in unit according to claim 9, wherein the at least one fender is generally elongated and extends in a direction generally coinciding with the direction of insertion of the plug-in unit into the electronic equipment unit.

14. A plug-in unit according to claim 9, wherein the at least one fender is disposed on a primary side of the plug-in unit.

15. A plug-in unit according to claim 9, wherein the at least one fender has a height as measured in a direction perpendicular to a side of the plug-in unit that is not less than a height of components or circuit elements on the side of the plug-in unit from a surface of the side of the plug-in unit.

16. A plug-in unit according to claim 9, wherein the at least one fender is separate from the plug-in unit and is secured thereto.

17. A plug-in unit according to claim 9, wherein the at least one fender is integrated in the plug-in unit.

18. A fender for protecting a plug-in unit having a generally planar bottom surface for securing to a plug-in unit, an elevated upper surface, and first and second ends;
   wherein the upper surface is at least partially curved or chamfered between the first and second ends, such that the upper surface is non-planar when viewed as a cross section of the fender in a direction that is perpendicular to a direction generally coinciding with a direction of insertion of the plug-in unit; and
   wherein the bottom surface is configured to rigidly secure the fender to the plug-in unit, such that the upper surface of the fender is configured so as not to move relative to the plug-in unit.

19. A fender according to claim 18, wherein at least portions of the upper surface of the fender has an elongated shape with a ramp-like curvature towards opposite ends of the bottom surface and formed of a material having electrostatic discharge (ESD) protective properties.

\* \* \* \* \*